US006674329B1

United States Patent
Stengel et al.

(10) Patent No.: US 6,674,329 B1
(45) Date of Patent: Jan. 6, 2004

(54) DISTRIBUTED RF AMPLIFIER WITH FILTERED DUMMY LOAD

(75) Inventors: Robert Stengel, Pompano Beach, FL (US); Nicholas Giovanni Cafaro, Coconut Creek, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/184,504

(22) Filed: Jun. 27, 2002

(51) Int. Cl.[7] ................................................ H03F 3/60

(52) U.S. Cl. ........................ 330/286; 330/295; 330/306

(58) Field of Search ................................ 330/286, 295, 330/306, 124 R, 84

(56) References Cited

U.S. PATENT DOCUMENTS

| | | | | |
|---|---|---|---|---|
| 5,021,743 A | * | 6/1991 | Chu et al. ..................... | 330/54 |
| 5,081,706 A | * | 1/1992 | Kim ............................. | 455/78 |
| 6,433,640 B1 | * | 8/2002 | Pavio et al. ................. | 330/295 |
| 6,472,941 B2 | * | 10/2002 | Shigematsu ................. | 330/286 |

OTHER PUBLICATIONS

Duperrier, C. et al., "New Design Method of Non–Uniform Distributed Power Amplifiers. Application to a Single Stage 1 W PHEMT MMIC," IEEE MTT–S Digest, 2001, pp. 1063–1066.

* cited by examiner

Primary Examiner—Henry Choe

(57) ABSTRACT

A distributed amplifier consistent with certain embodiments of the present invention has a plurality of amplifier sections 1 through N (302, 306) with each amplifier section having an input and an output. A plurality of N input transmission line sections are connected in series, with inputs of the 1 through N amplifier sections interconnected at their inputs along the series of input transmission line sections. A plurality of N output transmission line sections are also connected in series, with outputs of the 1 through N amplifier sections interconnected at their outputs along the series of input transmission line sections. A load (160) can be driven by an output at the Nth amplifier section (108). A high-pass filter (310) connects a dummy load (150) to the output of the first amplifier section (302). The input and output transmission line sections can, for example, be lumped element T sections and the high-pass filter can be made of a lumped element half section. To achieve the desired stability enhancement, the high pass filter section has a cutoff frequency equal to or greater than the cutoff frequency of the output transmission line sections. A similar high pass filter and dummy load can be used in the input transmission line network.

20 Claims, 3 Drawing Sheets

DISTRIBUTED RF AMPLIFIER WITH FILTERED DUMMY LOAD

FIELD OF THE INVENTION

This invention relates generally to the field of distributed RF (Radio Frequency) amplifiers. More particularly, this invention relates to stabilization of distributed amplifiers under high VSWR (Voltage Standing Wave Ratio) conditions.

BACKGROUND OF THE INVENTION

Load variations that often appear at the intended output terminals of a distributed amplifier can result in a reverse standing wave across the amplifier's distributed output network. This can place low or high impedance nulls at one or more of the distributed device drain or collector terminals causing instability or oscillation. Conventional linear distributed amplifier circuits are often implemented with a reverse wave resistive output termination in parallel with the intended output load. Use of a reverse wave termination resistor (i.e., a dummy load resistor), reduces the magnitude of the null impedance conditions eliminating generation of undesired non-harmonically related signals. Unfortunately, the penalty for using this reverse wave termination resistance is a reduction in output power level which also reduces the DC to RF conversion efficiency of the distributed amplifier. When such circuits are used in a battery powered transceiver product, reduced RF power amplifier conversion efficiency translates to a reduction in battery life.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
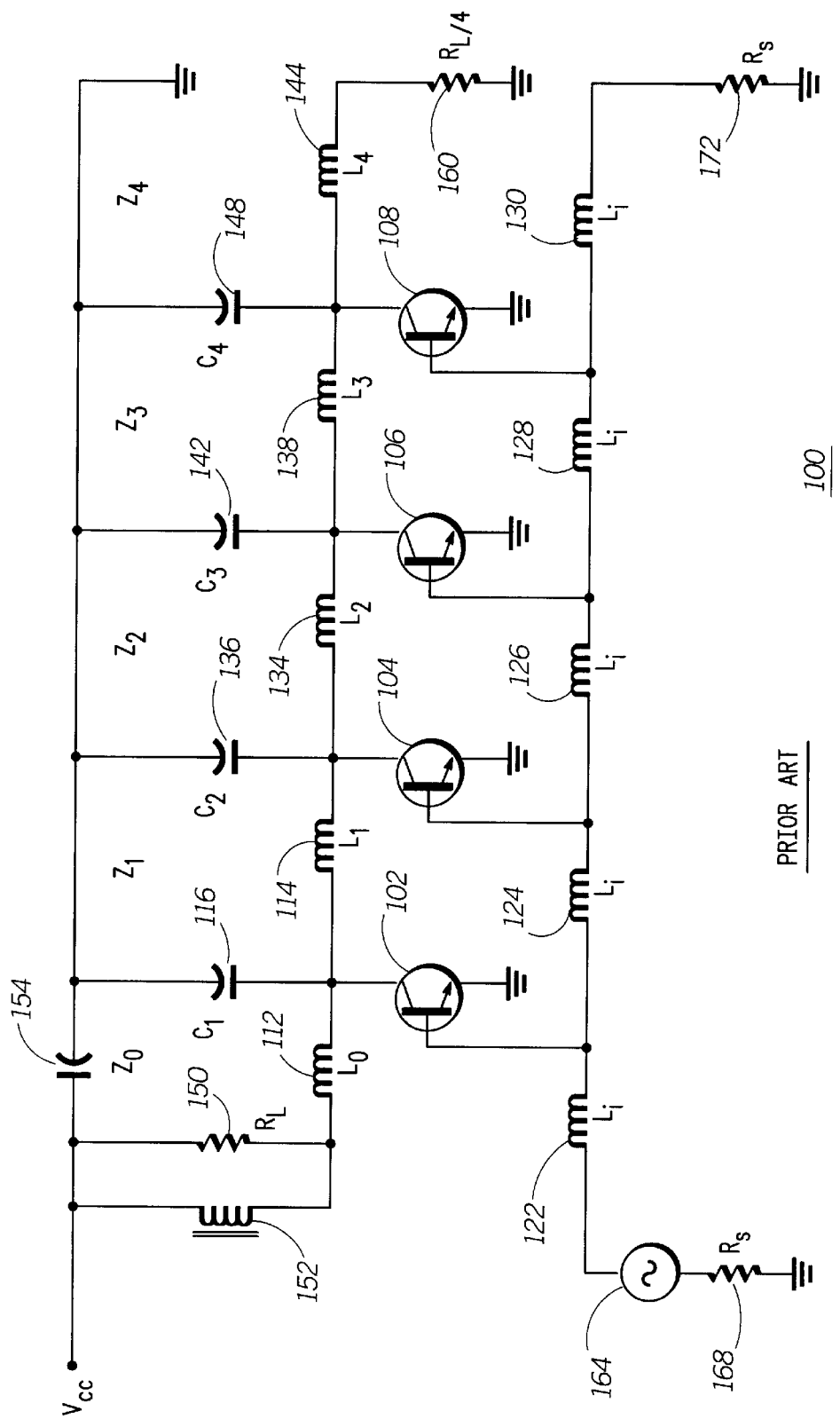
FIG. 1 is a schematic of a distributed amplifier circuit that uses a conventional dummy load arrangement.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

Certain embodiments of the present invention utilize a distributed amplifier output network with high-pass filter characteristics to provide reverse wave resistive termination where needed without loading the intended output terminals. Stable operation is provided for high voltage standing wave ratio (VSWR) conditions without impacting the maximum DC to RF conversion efficiency of a distributed linear RF power amplifier.

Turning now to FIG. 1, a more or less conventional distributed amplifier 100 that utilizes a dummy load is illustrated. A four stage amplifier is depicted using four transistors 102, 104, 106 and 108 as the active amplifying devices. This amplifier is implemented with artificial lumped transmission line networks interconnecting the individual devices in both the input and output networks. More specifically these networks are often either a low pass pi or T artificial lumped implementation of a transmission line with several variations such as constant K or m-derived full or half sections.

In the network shown, each transistor has an output network associated therewith which is made up of a lumped element T section. For example, transistor 102 has an output network made up of inductors 112 and 114 which resonate with capacitor 116 in parallel with the collector to emitter capacitance $C_{ce102}$ of transistor 102. Similarly, the first amplifier stage has a lumped element T section made up of inductors 122 and 124 that resonate with the base to emitter capacitance $C_{be102}$ of transistor 102. Each of transistors 102, 104, 106 and 108 have similar lumped element T sections at the input and output with the inductances between stages being shared by adjacent T sections. Thus, transistor 104 has an input at the base connected to the junction of inductors 124 and 126, transistor 106 has an input at the base connected to the junction of inductors 126 and 128, and transistor 108 has an input at the base connected to the junction of inductors 128 and 130. Similarly, the output at the collector of transistor 104 is connected to inductors 114 and 134 with a capacitor 136 to ground, the output at the collector of transistor 106 is connected to inductors 134 and 138 with a capacitor 142 to ground, and the output at the collector of transistor 108 is connected to inductors 138 and 144 with a capacitor 148 to ground. Collectively, these transistor sections drive load resistance 160. The drive source 164 with a source resistance $R_S$ 168 drives the amplifier's input. The input network is terminated with a corresponding resistance 172. For purposes of equations to follow, these passive elements are also designated with subscripted letter designations.

These lumped element transmission line sections (T sections in this example) have an upper frequency response limit referred to as the corner frequency defined for a constant k low pass filter as:

$$f_C = \frac{2}{2\pi\sqrt{LC}} \qquad \text{Equation 1}$$

Where C is the shunt parasitic capacitance of the individual device input or output, in parallel with any parallel capacitance. For a power amplifier application where stepped impedance sections are used in the output networks (i.e., a tapered transmission line design), determining whether the input or output limits the upper low pass corner frequency is more complicated than looking for the larger value. In this example, the input capacitance of the transistors are a dominating factor in determining the frequency response of the transistor.

The corner frequency $f_c$ is the frequency where the artificial lumped transmission line begins to fail to represent a transmission line network transformation. This is usually a much lower frequency than that of the individual device frequency $f_t$ where the forward transfer function diminishes to a voltage gain of one. The device frequency parameter $f_t$ is limited by the terminal real and reactive values associated with the device model such as $r_o$ and $c_o$, the output shunt resistant and capacitance. As the corner frequency $f_c$ of the artificial transmission line is approached from a lower frequency the VSWR increases while the device forward gain remains at nominal operating level well below $f_t$. The result is potential non-linear behavior or oscillations about the corner frequency associated with the distributed amplifier artificial transmission line interconnection network.

To aid in mitigating this condition and to satisfy any reverse standing wave conditions, an additional low pass section is added to the opposite terminal of the output of the distributed amplifier, as shown in FIG. 1. This dummy load network is made up of inductor 112 and resistor 150. DC bias current is supplied through a choke 152 and may be filtered by a bypass capacitor 154. This dummy load network acts as a load to reverse waves set up in the amplifier, to dissipate such standing waves. In the example of FIG. 1, the dummy load is in effect coupled to the amplifier network through inductor 112 to form a low pass filtering mechanism to the dummy load 150.

The input inductance at each stage of this exemplary amplifier is determined using the following relation where $C_{be}$ is the shunt base to emitter capacitance of each individual device of the distributed amplifier circuit.

$$L_i = R_S^2 C_{be} \qquad \text{Equation 2}$$

The artificial transmission line cutoff frequency $f_c$ for this bipolar example is thus:

$$f_C = \frac{1}{\pi \sqrt{L_i C_{be}}} \qquad \text{Equation 3}$$

To maintain this cutoff frequency in the output network with stepped values that will maximize DC to RF conversion efficiency the product of $L_i$ and $C_{be}$ is held constant while the ratio of $L_i$ divided by $C_{be}$ is varied. The square root of this ratio is known as the characteristic impedance ($Z_o$) of the artificial transmission line section and is determined for each of the values $Z_x$ shown in FIG. 1 as follows:

$$Z_4 = R_L/4 \qquad \text{Equation 4}$$

$$Z_3 = R_L/3 \qquad \text{Equation 5}$$

$$Z_2 = R_L/2 \qquad \text{Equation 6}$$

$$Z_1 = R_L \qquad \text{Equation 7}$$

$$Z_o = R_L \qquad \text{Equation 8}$$

The output inductance values are a factor of the input inductance as follows:

$$L_4 = \frac{L_i \frac{R_L/4}{R_S}}{2} \qquad \text{Equation 9}$$

$$L_3 = L_i(Z_3/R_s) \qquad \text{Equation 10}$$

$$L_2 = L_i(Z_2/R_s) \qquad \text{Equation 11}$$

$$L_1 = L_i(Z_1/R_s) \qquad \text{Equation 12}$$

$$L_0 = \frac{L_i(Z_O/R_S)}{2} \qquad \text{Equation 13}$$

and the output network capacitance values are determined as follows:

$$C_4 = \frac{C_{be} R_S \left( \frac{1}{Z_4} + \frac{1}{Z_3} \right)}{2} - C_{ce} \qquad \text{Equation 14}$$

$$C_3 = \frac{C_{be} R_S \left( \frac{1}{Z_3} + \frac{1}{Z_2} \right)}{2} - C_{ce} \qquad \text{Equation 15}$$

$$C_2 = \frac{C_{be} R_S \left( \frac{1}{Z_2} + \frac{1}{Z_1} \right)}{2} - C_{ce} \qquad \text{Equation 16}$$

$$C_1 = \frac{C_{be} R_S \left( \frac{1}{Z_1} + \frac{1}{Z_0} \right)}{2} - C_{ce} \qquad \text{Equation 17}$$

The above procedure assumes each of the distributed devices is equal with approximately the same input and output model values $C_{be}$ and $C_{ce}$. In addition each of the devices are set up to provide equal output signal contribution. Alternative implementations with non equal distributed device size and operating conditions can be accommodated with a modified set of component value relations. The only assumption for the relations of Equation 14 through Equation 17, is that the capacitance values are positive or that $C_{ce}$ is small compared to $C_{be}$ and the ratio of $R_S$, $R_L$, and $Z_x$.

The dummy load network shown in FIG. 1 has reverse wave termination resistance implemented as resistor $R_L$ on the left side of the distributed artificial transmission line sections. It is connected with a low pass half section network made up of inductor 112 ($L_0$) and a portion of the shunt capacitor 116 ($C_1$). This reverse wave low pass half section has the same frequency response as all of the other distributed output network sections and further has the VSWR transition about the cutoff frequency. Thus, this reverse wave termination network is not effective above or about the cutoff frequency to mitigate high value VSWR conditions imposed by the artificial transmission line output or input network.

Figure 2:
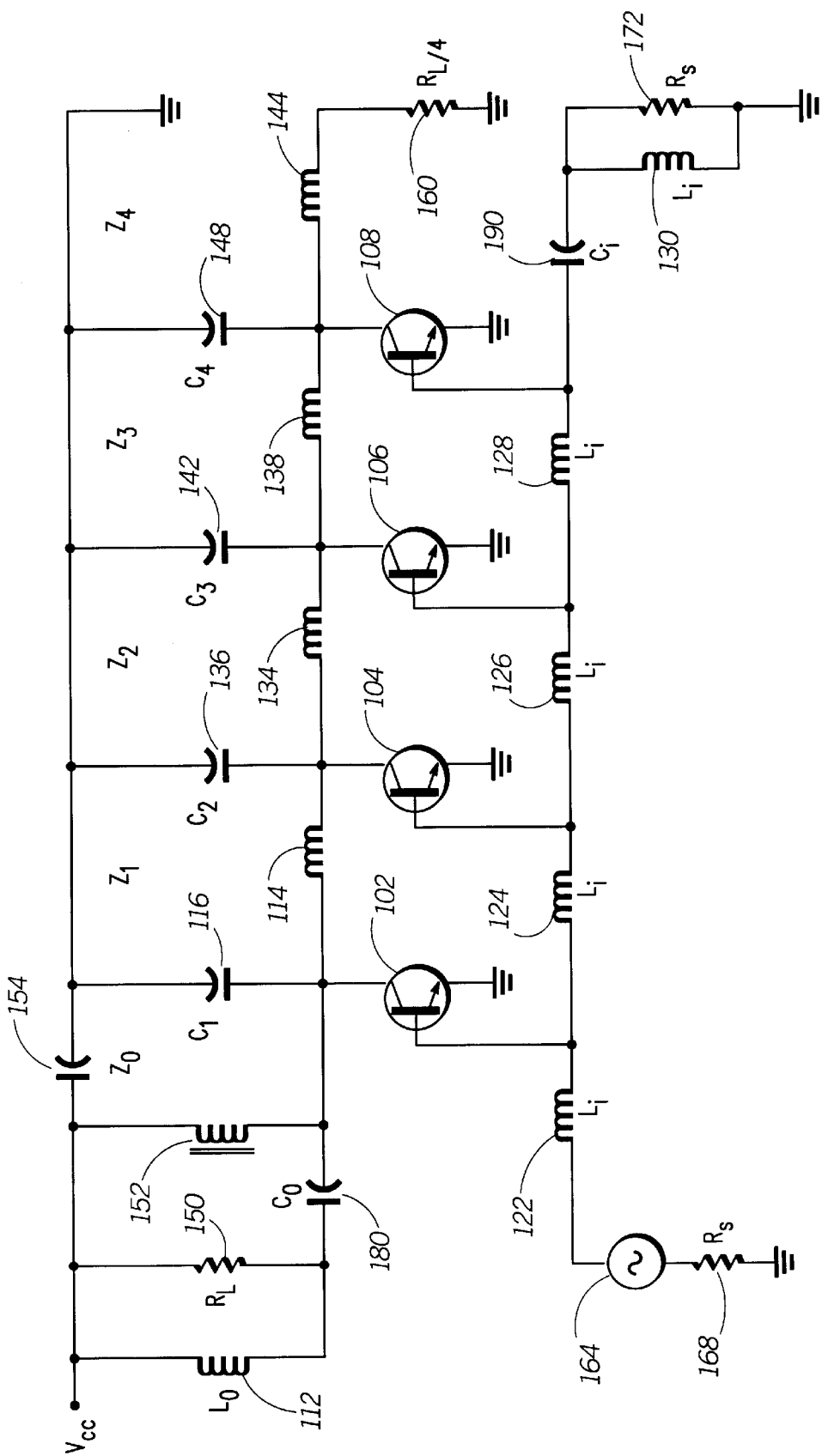
FIG. 2 is a schematic of an exemplary four stage distributed RF amplifier that uses high pass filtering in the dummy load network in a manner consistent with certain embodiments of the present invention.

Embodiments of the present invention overcome this limitation by providing a high pass artificial half section network connecting the reverse wave termination resistance to the distributed amplifier devices as illustrated in FIG. 2. In addition this high pass half section can be optimized to improve linear amplitude and phase response about the cutoff frequency while the stability criteria are being satisfied. A high pass section has the added benefit of improved stability conditions above the cutoff frequency where the low pass sections are sure to reach very high VSWR values.

Refering now to FIG. 2, in order to implement the high pass filtering in the output dummy load network in accordance with certain embodiments of the present invention, the inductor $L_0$ 112 is moved to a shunt element in parallel with the reverse wave termination resistor 150 and a new component $C_0$ 180 added in series with the dummy load 150 and inductor 112 as shown. DC bias current continues to be supplied through choke 152, which is placed on the transistor side of capacitor 180. The value of $C_0$ and $L_0$ can be determined using the following relations, in accordance with certain embodiments of the invention:

$$C_0 = 2/(\omega_C^2 L_1(Z_0/R_S))$$  Equation 18

$$L_0 = 1/(\omega_C^2 C_{be} R_s/2Z_0)$$  Equation 19 and the shunt capacitance $C_1$ is modified to be:

$$C_1 = C_{be} R_S (1/Z_{1i})/2 - C_{ce}$$  Equation 20

Simulation results show 59% PAE (Power Added Efficiency) for a low pass reverse wave network and 67% for a high pass reverse wave network. By using a high pass network to connect the dummy load resistor 150 to the distributed amplifier, a reverse wave termination is supplied where it is needed most—above or about the cutoff frequency of the output artificial transmission line. The exact cutoff frequency of the high pass network is a design consideration that involves tradoffs between efficiency and stability, but use of the high pass network as taught herein offers improvement in efficiency and stability for a given dummy load terminating network impedance.

FIG. 2 further illustrates that a high pass filtered dummy load can also be used to terminate the input network. In this illustration, capacitor $C_i$ 190 is added in series with the input dummy load resistance 172, and inductor 130 is moved to a position in parallel with the dummy load 172. The corner frequency for this high pass filtered input dummy load can be calculated in a straightforward manner similar to the prior calculation. A high pass filtered dummy load on the input will have similar stabilizing effects on the distributed amplifier. Moreover, the high pass filtered dummy load on the input of the distributed amplifier also enhances efficiency, albiet perhaps to a somewhat lesser extent.

Figure 3:
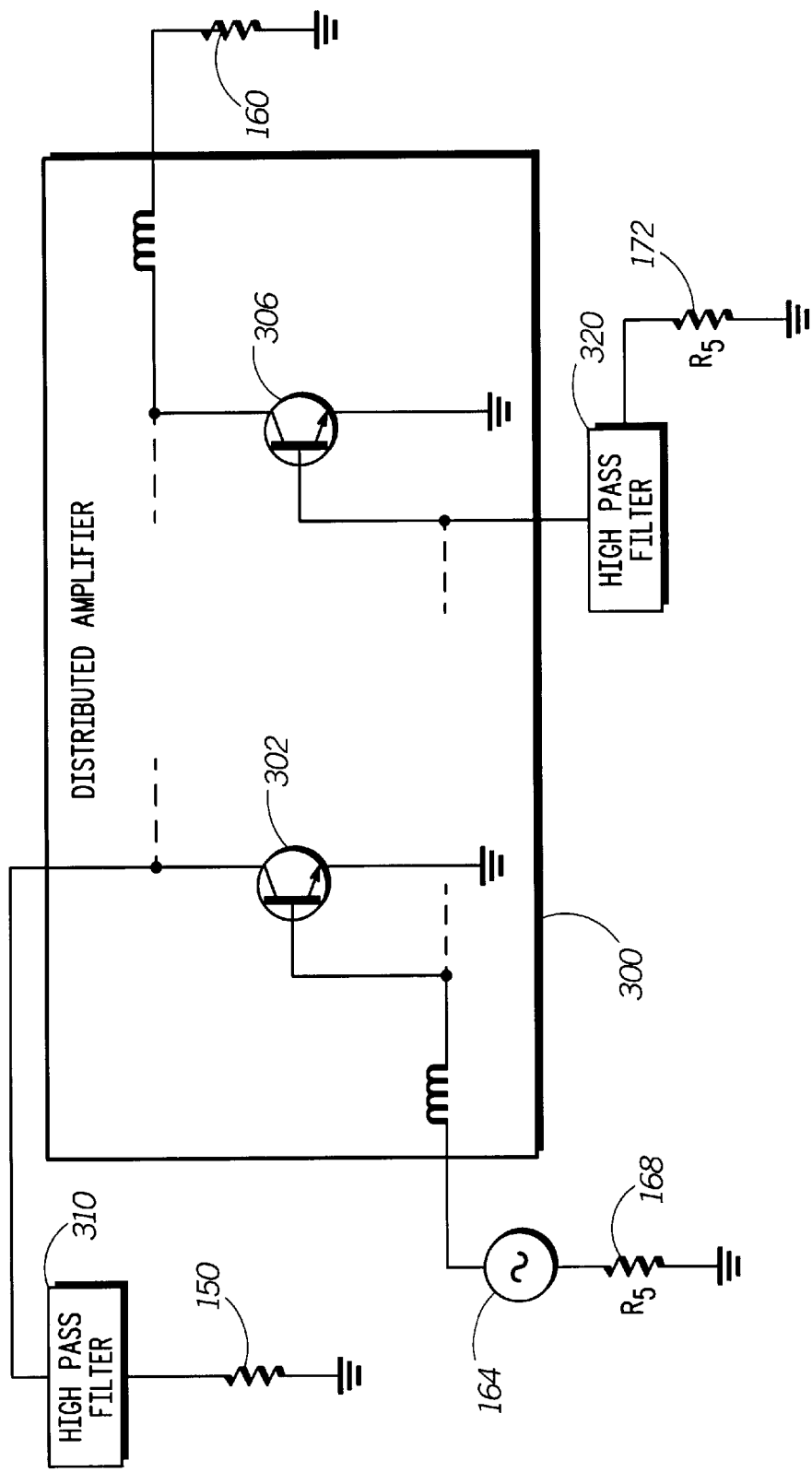
FIG. 3 is a block diagram of a distributed amplifier arrangement illustrating a high pass filtering technique consistent with certain embodiments of the present invention.

The overall concept of the high-pass filtered dummy load is illustrated in FIG. 3. The distributed amplifier has an input that is driven by a source 164 having an internal resistance 168. This input signal is distributed along a series of transmission line sections (e.g., lumped element sections) to each of the inputs of the amplifier elements (e.g., transistors) of the distributed amplifier 300. A first amplifier element 302 is situated at one end of the distributed amplifier and an Nth amplifier element 306 is situated at the output end of the distributed amplifier. An input transmission line distributes input from source 164 to inputs of each of the amplifier elements 302 through 306 along the series of input transmission line sections.

At the Nth section of the distributed amplifier, the output is coupled to a load 160 in a manner such that the outputs of each section of the distributed amplifier's output is added together to collectively drive the load 160. This is accomplished by connecting the output terminals of the amplifier elements 302 through 306 to a transmission line that is generally made up of a sequence of lumped element transmission line sections. Thus, each amplifier section is connected at input and output with its adjacent amplifier section(s) with a transmission line section.

In accord with certain embodiments of the present invention, a dummy load 150 is coupled to the output of the first amplifier element (at the opposite end of the sequence of amplifier sections from the load 160) through a high pass filter network 310. This high pass filter network 310 may be a simple series capacitance of suitable value to form a high pass frequency corner with the dummy load 150 together with any impedance seen at the output of the first amplifier stage. This distributed amplifier circuit, has a distributed amplifier having N amplifier sections that drive a load with a reverse wave dummy load 150 coupled to the distributed amplifier through a high pass filter 310.

In a similar manner, an input dummy load can be utilized in the amplifier shown in FIG. 3. The input dummy load resistance 172 is connected in series with a high pass filter 320 at the load end of the input network between the input of the final transistor 306 and RF ground. This high pass filtered input dummy load can be used alone or in combination with a high pass filtered output dummy load, or a high pass filtered output dummy load can be used alone.

Thus, a distributed amplifier consistent with certain embodiments of the present invention has a plurality of amplifier sections 1 through N with each amplifier section having an input and an output. A plurality of N input transmission line sections are connected in series, with inputs of the 1 through N amplifier sections interconnected at their inputs along the series of input transmission line sections. A plurality of N output transmission line sections are also connected in series, with outputs of the 1 through N amplifier sections interconnected at their outputs along the series of input transmission line sections. A load can be driven by an output at the Nth amplifier section. An output high-pass filter connects an output dummy load to the output of the first amplifier section. The input and output transmission line sections can, for example, be lumped element pi or T sections and the high-pass filter can be made of a lumped element half section. To achieve the desired stability enhancement, the output high pass filter section has a cutoff frequency equal to or greater than the cutoff frequency of the output transmission line sections.

A distributed amplifier consistent with certain other embodiments of the present invention has a plurality of amplifier sections 1 through N with each amplifier section having an input and an output. A plurality of N input transmission line sections are connected in series, with inputs of the 1 through N amplifier sections interconnected at their inputs along the series of input transmission line sections. A plurality of N output transmission line sections are also connected in series, with outputs of the 1 through N amplifier sections interconnected at their outputs along the series of input transmission line sections. A load can be driven by an output at the Nth amplifier section. An input high-pass filter connects an input dummy load to the input of the Nth amplifier section. The input and output transmission line sections can, for example, be lumped element pi or T sections and the input high-pass filter can be made of a lumped element half section. To achieve the desired stability enhancement, the input pass filter section has a cutoff frequency equal to or greater than the cutoff frequency of the input transmission line sections.

Thus, a distributed amplifier circuit consistent with certain embodiments of the present invention has a distributed amplifier with N amplifier sections that drive a load. A reverse wave dummy load is coupled to the distributed amplifier through a high pass filter. The distributed amplifier has an input transmission line network and an output transmission line network. The reverse wave dummy load can be connected to the distributed amplifier in a manner that provides a high pass filtered dummy load to the input transmission line network and/or the output transmission line network.

Those skilled in the art will understand that the distributed amplifiers depicted herein are depicted as using bipolar transistors. However, distributed amplifiers are commonly implemented using other types of transistors including, but not limited to, vacuum tubes, field effect transistors, gallium arsenide devices, MOSFETS, MESFETS, etc. Moreover, the present illustrative examples are shown as single ended amplifiers, but the concepts described herein are equally and equivalently applicable to differential amplifier configurations. Such variations are equivalent and within the scope of the present invention. Additionally, the transmission lines can be any suitable lumped element approximation (for example, lumped element T or pi networks) or actual transmission lines such as striplines or combinations thereof, and may or may not be tapered distributed transmission lines (as in the exemplary embodiment), without departing from the present invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A distributed amplifier circuit for amplifying AC signals over a range of frequencies, comprising:
    a distributed amplifier having N amplifier sections that drive a load, the distributed amplifier having a plurality of N inputs and a plurality of N outputs;
    a plurality of N input transmission line sections connected in series, the N inputs of the N amplifier sections being interconnected at their inputs along the series of input transmission line sections;
    a plurality of N output transmission line sections connected in series, the N amplifier sections being interconnected at their outputs along the series of output transmission line sections;
    a high-pass filter that performs a high pass filtering function that passes frequencies greater than the range of frequencies;
    wherein, at least one of the input and output transmission line sections have a cutoff frequency, and wherein the high pass filter has a cutoff frequency at least as great as the cutoff frequency of the at least one of the input and output transmission line sections; and
    a reverse wave dummy load coupled to the distributed amplifier through the high pass filter.

2. The distributed amplifier circuit according to claim 1, wherein the high pass filter is connected to the input of the Nth amplifier section.

3. The distributed amplifier in accordance with claim 1, wherein the input transmission line sections comprise at least one of a lumped element T section and a lumped element pi section.

4. The distributed amplifier in accordance with claim 1, wherein the high pass filter section has a cutoff frequency at least as great as the cutoff frequency of the input transmission line sections.

5. The distributed amplifier in accordance with claim 1, wherein the high pass filter is connected to the output of the first amplifier section.

6. The distributed amplifier in accordance with claim 1, wherein the output transmission line sections comprise at least one of a lumped element T section and a lumped element pi section.

7. The distributed amplifier in accordance with claim 1, wherein the high pass filter section has a cutoff frequency at least as great as the cutoff frequency of the output transmission line sections.

8. A distributed amplifier in accordance with claim 1, wherein the high-pass filter comprises lumped element half section.

9. A distributed amplifier in accordance with claim 1, wherein the reverse wave dummy load is connected to the distributed amplifier in a manner that provides a high pass filtered dummy load to the input transmission line network.

10. A distributed amplifier in accordance with claim 1, wherein the reverse wave dummy load is connected to the distributed amplifier in a manner that provides a high pass filtered dummy load to the output transmission line network.

11. A distributed amplifier for amplifying AC signals over a range of frequencies, comprising:
    a plurality of amplifier sections 1 through N with each amplifier section having an input and an output;
    a plurality of N input transmission line sections connected in series, with inputs of the 1 through N amplifier sections being interconnected at their inputs along the series of input transmission line sections;
    a plurality of N output transmission line sections connected in series, with outputs of the 1 through N amplifier sections being interconnected at their outputs along the series of input transmission line sections;
    an output for driving a load at the Nth amplifier section;
    an input dummy load; and
    an input high-pass filter connecting the dummy load to the input of the Nth amplifier section that performs a high pass filtering function that passes frequencies greater than the range of frequencies, wherein the input transmission line sections have a cutoff frequency, and wherein the input high pass filter section has a cutoff frequency at least as great as the cutoff frequency of the input transmission line sections.

12. The distributed amplifier in accordance with claim 11, wherein the output transmission line sections comprise at least one of a lumped element T section and a lumped element pi section.

13. The distributed amplifier in accordance with claim 11, wherein the input transmission line sections comprise at least one of a lumped element T section and a lumped element pi section.

14. The distributed amplifier in accordance with claim 11, wherein the input high-pass filter comprises lumped element half section.

15. A distributed amplifier for amplifying AC signals over a range of frequencies, comprising:
    a plurality of amplifier sections 1 through N with each amplifier section having an input and an output;
    a plurality of N input transmission line sections connected in series, with inputs of the 1 through N amplifier sections being interconnected at their inputs along the series of input transmission line sections;
    a plurality of N output transmission line sections connected in series, with outputs of the 1 through N amplifier sections being interconnected at their outputs along the series of input transmission line sections;
    an output for driving a load at the Nth amplifier section;
    an output dummy load; and
    an output high-pass filter connecting the dummy load to the output of the first amplifier section, that performs a high pass filtering function that passes frequencies greater than the range of frequencies, wherein the output transmission line sections have a cutoff frequency, and wherein the output high pass filter has a cutoff frequency at least as great as the cutoff frequency of the output transmission line sections.

16. The distributed amplifier in accordance with claim 15, wherein the output transmission line sections comprise at least one of a lumped element T section and a lumped element pi section.

17. The distributed amplifier in accordance with claim 15, wherein the input transmission line sections comprise at least one of a lumped element T section and a lumped element pi section.

18. The distributed amplifier in accordance with claim 15, wherein the high-pass filter comprises lumped element half section.

19. The distributed amplifier in accordance with claim 15, further comprising an input dummy load; and an input high pass filter connecting the dummy load to the input of the Nth amplifier section.

20. A distributed amplifier, comprising:

a plurality of amplifier sections 1 through N with each amplifier section having an input and an output;

a plurality of N input transmission line sections connected in series, with inputs of the 1 through N amplifier sections being interconnected at their inputs along the series of input transmission line sections, wherein the input transmission line sections comprise at least one of a lumped element T section and a lumped element pi section;

a plurality of N output transmission line sections connected in series, with outputs of the 1 through N amplifier sections being interconnected at their outputs along the series of input transmission line sections, wherein the output transmission line sections comprise at least one of a lumped element T section and a lumped element pi section;

an output for driving a load at the Nth amplifier section;

an input dummy load;

an output dummy load;

a lumped element half section output high-pass filter connecting the output dummy load to the output of the first amplifier section; and a lumped element half section input high-pass filter connecting the input dummy load to the input of the Nth amplifier section, wherein the output transmission line sections have a cutoff frequency, and wherein the high pass filter section has a cutoff frequency at least as high as the cutoff frequency of the output transmission line sections, and wherein the input transmission line sections have a cutoff frequency, and wherein the input high pass filter section has a cutoff frequency at least as high as the cutoff frequency of the input transmission line sections.

* * * * *